(12) United States Patent
Cheng et al.

(10) Patent No.: US 11,493,813 B2
(45) Date of Patent: Nov. 8, 2022

(54) ARRAY SUBSTRATE AND DISPLAY DEVICE

(71) Applicant: Boe Technology Group Co., Ltd., Beijing (CN)

(72) Inventors: Hongfei Cheng, Beijing (CN); Jianbo Xian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/521,503

(22) PCT Filed: Oct. 11, 2016

(86) PCT No.: PCT/CN2016/101767
§ 371 (c)(1),
(2) Date: Apr. 24, 2017

(87) PCT Pub. No.: WO2017/076153
PCT Pub. Date: May 11, 2017

(65) Prior Publication Data
US 2017/0307949 A1    Oct. 26, 2017

(30) Foreign Application Priority Data
Nov. 5, 2015  (CN) .......................... 201520876580.0

(51) Int. Cl.
*G02F 1/1362* (2006.01)
*G02F 1/1368* (2006.01)
(Continued)

(52) U.S. Cl.
CPC ...... *G02F 1/136286* (2013.01); *G02F 1/1368* (2013.01); *G02F 1/136227* (2013.01);
(Continued)

(58) Field of Classification Search
None
See application file for complete search history.

(56) References Cited

U.S. PATENT DOCUMENTS 7,084,934 B2 *   8/2006  Kim ...................... G02F 1/1368
                                                 257/72
9,196,637 B1 *  11/2015  Cheng ............... G02F 1/136286
(Continued)

FOREIGN PATENT DOCUMENTS

CN        1987626 A        6/2007
CN      102254917 A       11/2011
(Continued)

OTHER PUBLICATIONS

Search Report for International Patent Application No. PCT/CN2016/101767 dated Dec. 28, 2016.

*Primary Examiner* — Shaun M Campbell
(74) *Attorney, Agent, or Firm* — Calfee, Halter & Griswold LLP

(57) ABSTRACT

An array substrate and a display device is disclosed. The array substrate includes a base substrate, a plurality of gate lines and a plurality of data lines arranged to intersect each other on the base substrate, a pixel electrode arranged in a region defined by an adjacent gate line and an adjacent data line, and a thin film transistor arranged at an intersection of the gate lines and the data lines. A drain of the thin film transistor is connected with the pixel electrode through a via hole. The gate lines further include a widening portion between adjacent data lines. The widening portion comprises a recess structure. An orthogonal projection of the recess structure on the base substrate at least partly overlaps that of the drain of the thin film transistor on the base substrate.

13 Claims, 4 Drawing Sheets

(51) Int. Cl.
*H01L 27/12* (2006.01)
*G02F 1/136* (2006.01)

(52) U.S. Cl.
CPC ........ *H01L 27/124* (2013.01); *G02F 1/13606* (2021.01); *G02F 2201/123* (2013.01)

(56) References Cited

U.S. PATENT DOCUMENTS

| | | | | |
|---|---|---|---|---|
| 9,417,497 | B1* | 8/2016 | Yao | G02F 1/136286 |
| 2002/0097364 | A1* | 7/2002 | kwon | G02F 1/1368 |
| | | | | 349/139 |
| 2004/0125262 | A1* | 7/2004 | Cho | G02F 1/1368 |
| | | | | 349/43 |
| 2004/0227893 | A1* | 11/2004 | Nam | G02F 1/136286 |
| | | | | 349/145 |
| 2005/0056847 | A1* | 3/2005 | Nakamura | H01L 27/016 |
| | | | | 257/72 |
| 2007/0236625 | A1* | 10/2007 | Wang | G02F 1/1343 |
| | | | | 349/54 |
| 2011/0079781 | A1* | 4/2011 | Chang | H01L 27/124 |
| | | | | 257/E27.111 |
| 2013/0009155 | A1* | 1/2013 | Chang | H01L 27/1259 |
| | | | | 257/E33.012 |
| 2015/0129882 | A1* | 5/2015 | Jiang | H01L 29/42384 |
| | | | | 438/159 |
| 2015/0364494 | A1* | 12/2015 | Cheng | G02F 1/136286 |
| | | | | 257/72 |
| 2016/0099327 | A1* | 4/2016 | Kwak | H01L 27/1222 |
| | | | | 257/72 |

FOREIGN PATENT DOCUMENTS

| | | |
|---|---|---|
| CN | 103412449 A | 11/2013 |
| CN | 205067935 U | 3/2016 |

* cited by examiner

ARRAY SUBSTRATE AND DISPLAY DEVICE

The present application is the U.S. national phase entry of PCT/CN2016/101767, with an international filling date of Oct. 11, 2016, which claims the benefit of Chinese Patent Application No. 201520876580.0, filed on Nov. 5, 2015, the entire disclosures of which are incorporated herein by reference.

FIELD

This disclosure relates to the field of display technologies, and in particular to an array substrate and a display device.

BACKGROUND ART

At present, thin film transistor liquid crystal displays have been widely used in televisions, mobile phones and common information display devices. A thin film transistor liquid crystal display comprises a thin film transistor array substrate. Specifically, a gate of the thin film transistor is connected with a gate line, and the gate line is connected with a gate driving circuit via a gate lead located in a peripheral region. In this way, the gate driving circuit provides a switching signal to the gate over the gate line and accordingly achieves graphic display. However, there are a plurality of data lines and gate lines in an array substrate, between which there are coupling capacitances. Additionally, coupling capacitances will also be present between the gate and a source/drain of the thin film transistor. Therefore, the coupling capacitances will be charged during signal transmission, which leads to a signal delay of the gate lines. In particular, in large-sized liquid crystal displays, the time required for charging the coupling capacitances will become longer, which leads to a more serious signal delay of the gate lines.

SUMMARY

It is an objective of embodiments of this disclosure to provide an array substrate and a display device for dealing with signal delay of gate lines.

According to embodiments in a first aspect of this disclosure, an array substrate is provided. The array substrate includes a base substrate, a plurality of gate lines and a plurality of data lines arranged to intersect each other on the base substrate, a pixel electrode arranged in a region defined by an adjacent gate line and an adjacent data line, and a thin film transistor arranged at an intersection of the gate lines and the data lines. Specifically, a drain of the thin film transistor is connected with the pixel electrode through a via hole. Additionally, in such an array substrate, the gate lines further comprise a widening portion between adjacent data lines. The widening portion comprises a recess structure. An orthogonal projection of the recess structure on the base substrate at least partly overlaps that of the drain of the thin film transistor on the base substrate.

According to a specific embodiment, in the array substrate provided by the above embodiments, an overlapping portion between the orthogonal projection of the drain of the thin film transistor on the base substrate and the orthogonal projection of the recess structure on the base substrate at least comprises a straight portion or a curved portion.

Further, according to another specific embodiment, an angle enclosed between an extension direction of a line connecting two ends of the straight portion or the curved portion as defined above and an extension direction of the gate lines is greater than 0° and smaller than 90°.

Still further, according to yet another specific embodiment, the angle enclosed between the extension direction of the line connecting two ends of the straight portion or the curved portion as defined above and the extension direction of the gate lines is greater than 30° and smaller than 60°.

According to a specific embodiment, in the array substrate provided by the above embodiments, an orthogonal projection of the via hole connecting the drain of the thin film transistor with the pixel electrode on the base substrate falls within the orthogonal projection of the recess structure on the base substrate.

According to an exemplary embodiment, in the array substrate provided by the above embodiments, an orthogonal projection of the via hole connecting the drain of the thin film transistor with the pixel electrode on the base substrate partly overlaps the orthogonal projection of the recess structure on the base substrate.

According to an exemplary embodiment, in the array substrate provided by the above embodiments, the orthogonal projection of the recess structure on the base substrate is in a shape of a square, a rectangle, a trapezoid or a semi-circle.

According to exemplary embodiments in a second aspect of this disclosure, a display device is provided. The display device comprises an array substrate as mentioned in any of the above embodiments.

In the array substrate and the display device provided by the embodiments of this disclosure, the gate lines comprise a widening portion between adjacent data lines. Accordingly, as compared with any existing approach, widths of the gate lines in some positions are greatly increased and resistances of the gate lines are decreased. This helps to reduce the time required for charging the coupling capacitances between the gate lines and the data lines, and thus reduces signal delay of the gate lines. Besides, since the widths are not increased at intersections of the gate lines and the data lines, the coupling capacitances between the gate lines and the data lines will not be increased. Furthermore, the widening portion further comprises a recess structure, which facilitates flexible wiring. Specifically, an orthogonal projection of the recess structure on the base substrate at least partly overlaps that of the drain of the thin film transistor on the base substrate. In other words, the drain of the thin film transistor passes through the recess structure. In this way, overlapping of the drain of the thin film transistor and the gate lines is reduced, and thereby the coupling capacitances between the drain of the thin film transistor and the gate lines can be reduced.

DETAILED DESCRIPTION OF EMBODIMENTS

This disclosure provides an array substrate and a display device for dealing with signal delay of gate lines. The array substrate and the display device provided in this disclosure will be illustrated in detail below with reference to the drawings and the embodiments.

Figure 1:
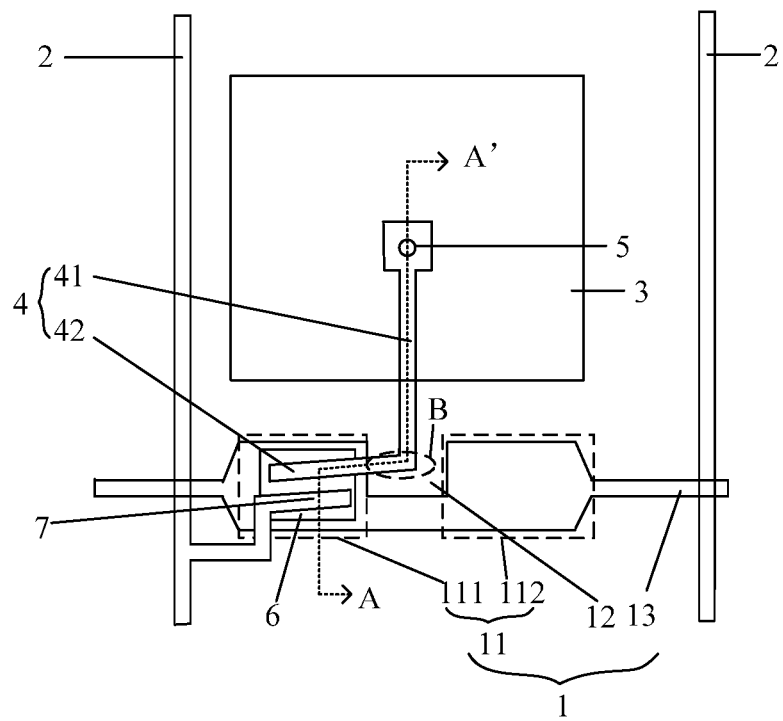
FIG. 1 is a schematic structure view of an array substrate according to an embodiment of this disclosure.

An embodiment of this disclosure provides an array substrate. As shown in FIG. 1, the array substrate includes a base substrate (specifically, see FIG. 2), a plurality of gate lines 1 and a plurality of data lines 2 arranged to intersect each other on the base substrate, a pixel electrode 3 arranged in a region defined by an adjacent gate line 1 and an adjacent data line 2, and a thin film transistor arranged at an intersection of the gate lines 1 and the data lines 2. Specifically, the drain 4 of the thin film transistor is connected with the pixel electrode 3 through a via hole 5. Furthermore, the gate lines 1 comprise a widening portion 11 between adjacent data lines 2. The widening portion 11 further comprises a recess structure 12. An orthogonal projection of the recess structure 12 on the base substrate at least partly overlaps that of the drain 4 of the thin film transistor on the base substrate.

In the array substrate provided by the embodiments of this disclosure, the gate lines 1 comprise a widening portion between adjacent data lines 2. Accordingly, as compared with any existing approach, widths of the gate lines 1 in some positions are greatly increased and resistances of the gate lines 1 are decreased. This helps to reduce the time required for charging the coupling capacitances between the gate lines 1 and the data lines 2, and thus reduces signal delay of the gate lines 1. Besides, since the widths are not increased at intersections of the gate lines 1 and the data lines 2, the coupling capacitances between the gate lines 1 and the data lines 2 will not be increased. Furthermore, the widening portion 11 further comprises a recess structure 12, which facilitates flexible wiring. Specifically, an orthogonal projection of the recess structure 12 on the base substrate at least partly overlaps that of the drain 4 of the thin film transistor on the base substrate. In other words, the drain 4 of the thin film transistor passes through the recess structure 12. In this way, overlapping of the drain 4 of the thin film transistor and the gate lines 1 is reduced, and thereby the coupling capacitances between the drain 4 of the thin film transistor and the gate lines 1 can be reduced.

According to a specific embodiment, referring to FIG. 1, the recess structure 12 divides the widening portion 11 into a first widening portion 111 and a second widening portion 112. A width of the first widening portion 111 of the gate lines can be the same as that of the second widening portion 112 of the gate lines. Obviously, the width of the first widening portion 111 of the gate lines can also be different from that of the second widening portion 112 of the gate lines.

Furthermore, according to another specific embodiment, referring to FIG. 1, a narrowing portion 13 is arranged at the intersections of the gate lines 1 and the data lines 2. A width of the narrowing portion 13 is smaller than that of the widening portion 11.

Furthermore, the thin film transistor further comprises an active layer 6, a source 7 and a gate. The source 7 of the thin film transistor is connected with the data lines 2, and the gate of the thin film transistor is connected with the gate lines.

Specifically, referring to FIG. 1, the first widening portion 111 of the gate lines 1 serves as a gate of the thin film transistor. The drain 4 of the thin film transistor comprises a first segment 41 and a second segment 42 interconnected with each other. An extension direction of the first segment 41 of the drain of the thin film transistor is parallel with an extension direction of the data lines 2. An orthogonal projection of the second segment 42 of the drain of the thin film transistor on the base substrate partly overlaps an orthogonal projection of the active layer 6 of the thin film transistor on the base substrate. Correspondingly, an orthogonal projection of the recess structure 12 on the base substrate at least partly overlaps the orthogonal projection of the second segment 42 of the drain of the thin film transistor on the base substrate. In FIG. 1, the overlapping portion is shown by a reference sign B. It should be noted here that the region indicated by the reference sign B does not necessarily show all overlapping portions. Instead, the reference sign B here is only provided for illustrating the embodiments of this disclosure.

Figure 2:
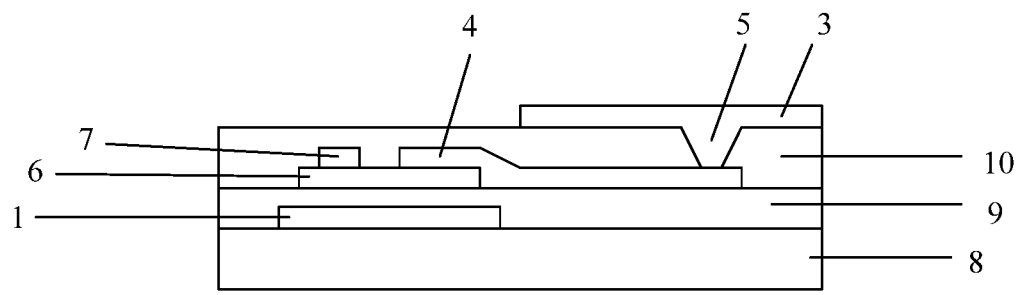
FIG. 2 is a sectional view of the array substrate in FIG. 1 along a direction of AA' according to an embodiment of this disclosure.

The above array substrate further comprises a gate insulating layer (specifically see FIG. 2) and a passivation layer (specifically see FIG. 2).

A sectional view of the array substrate in FIG. 1 along a direction of AA' is shown in FIG. 2. Specifically, the gate lines 1 are located on the base substrate 8. The gate insulating layer 9 is located on the base substrate 8 and the gate lines 1. The active layer 6 of the thin film transistor is located on the gate insulating layer 9. The source 7 of the thin film transistor is located on the active layer 6 of the thin film transistor. The drain 4 of the thin film transistor is located in the active layer 6 of the thin film transistor and the gate insulating layer 9. The passivation layer 10 is located on the drain 4 of the thin film transistor, the active layer 6 of the thin film transistor, the source 7 of the thin film transistor and the gate insulating layer 9. The via hole 5 is located in the passivation layer 10. The pixel electrode 3 is located on the passivation layer 10.

Furthermore, the gate lines 1, the data lines 2, the drain 4 of the thin film transistor and the source 7 of the thin film transistor can be made of aluminum or other metals.

Furthermore, the gate insulating layer 9 can be either mono-layered or multi-layered, and it can be made of silicon nitride or silicon oxide.

Furthermore, the active layer 6 of the thin film transistor can be made of amorphous silicon, polysilicon, microcrystalline silicon, or indium gallium zinc oxide.

Furthermore, the passivation layer 10 can be made of inorganics such as silicon nitride; or organic insulating materials such as organic resin materials.

Furthermore, the pixel electrode 3 can be made of indium tin oxide (ITO), indium zinc oxide (IZO) or other conductive materials of transparent metallic oxides.

In the above specific embodiment, furthermore, an overlapping portion between the orthogonal projection of the drain 4 of the thin film transistor on the base substrate and the orthogonal projection of the recess structure 12 on the base substrate at least comprises a straight portion or a curved portion.

In an embodiment of this disclosure, the shape of the overlapping portion between the orthogonal projection of the drain 4 of the thin film transistor on the base substrate and the orthogonal projection of the recess structure 12 on the base substrate can be arranged flexibly upon actual needs. Exemplarily, such an overlapping portion at least comprises a straight portion or a curved portion, which makes design of the array substrate more flexible.

Furthermore, an angle enclosed between an extension direction of a line connecting two ends of such a straight portion or curved portion and an extension direction of the gate lines 1 is greater than 0° and smaller than 90°.

Figure 3:
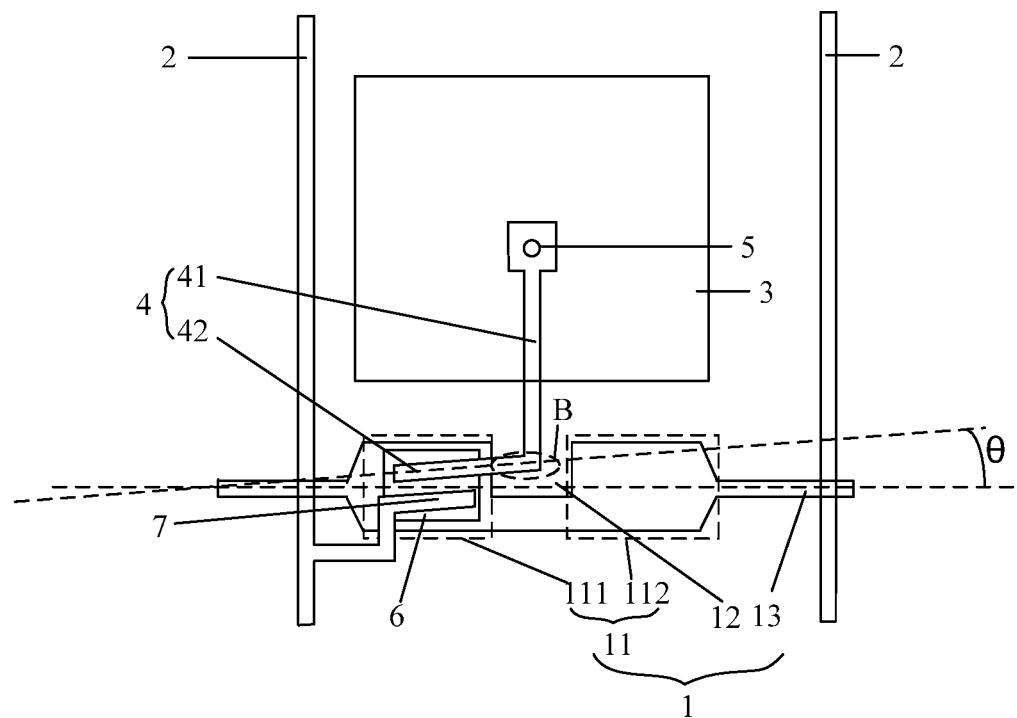
FIG. 3 is a schematic shape view of an overlapping portion between the orthogonal projection of the drain of the thin film transistor on the base substrate and the orthogonal projection of the recess structure on the base substrate according to an embodiment of this disclosure, wherein the overlapping portion at least comprises a straight portion, and an angle θ is enclosed between an extension direction of a line connecting two ends of the straight portion and an extension direction of the gate lines.
Figure 4:
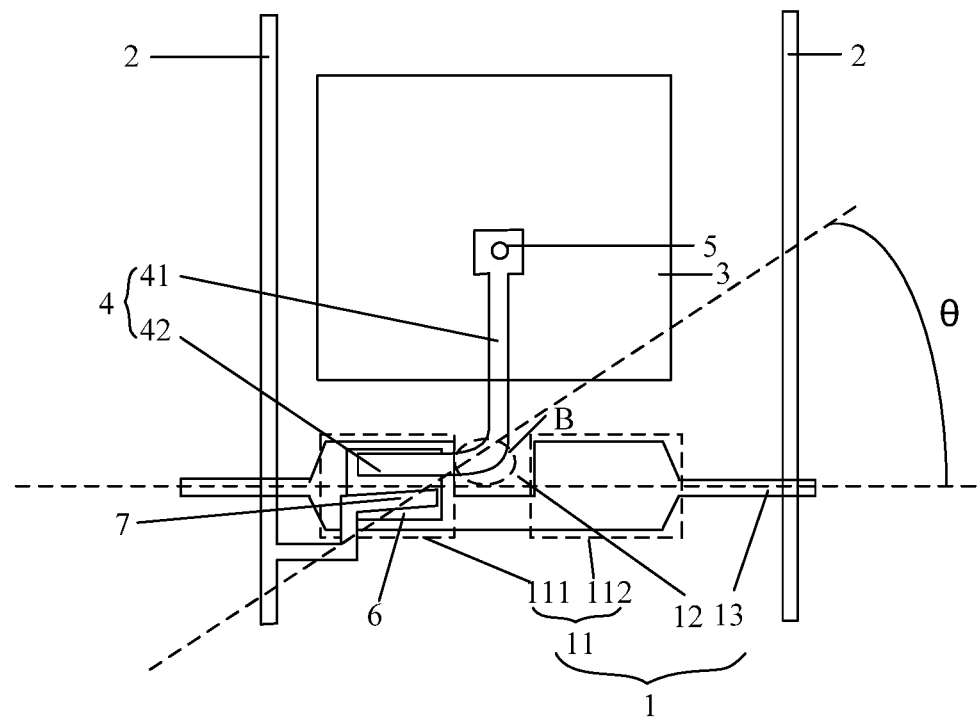
FIG. 4 is a schematic shape view of an overlapping portion between the orthogonal projection of the drain of the thin film transistor on the base substrate and the orthogonal projection of the recess structure on the base substrate according to an embodiment of this disclosure, wherein the overlapping portion at least comprises a curved portion, and an angle θ is enclosed between an extension direction of a line connecting two ends of the curved portion and an extension direction of the gate lines.

FIG. 3 shows an angle θ enclosed between the extension direction of the line connecting two ends of the straight portion and the extension direction of the gate lines 1. FIG. 4 shows an angle θ enclosed between the extension direction of the line connecting two ends of the curved portion and the extension direction of the gate lines 1. In FIG. 3 and FIG. 4, the meaning of the region indicated by B is the same as the meaning of the region indicated by B in FIG. 1.

In an embodiment of this disclosure, the straight portion or the curved portion of the overlapping portion between the orthogonal projection of the drain 4 of the thin film transistor on the base substrate and the orthogonal projection of the recess structure 12 on the base substrate is arranged in the recess structure 12 and tilted relative to the gate lines 1. In this way, the width of the gate lines 1 occupied by the recess structure 12 is as small as possible. In this case, oppositely, the width outside the recess structure 12 of the gate lines 1 will be large, which reduces resistances of the gate lines 1. Accordingly, the time required for charging the coupling capacitances between the gate lines 1 and the data lines 2 and between the gate and the source and the drain of the thin film transistor will be decreased, and thereby signal delay of the gate lines 1 will be reduced.

In order to further reduce the signal delay of the gate lines 1, optionally, in the above related embodiments, an angle enclosed between an extension direction of a line connecting two ends of the straight portion or the curved portion and an extension direction of the gate lines is greater than 30° and smaller than 60°.

It should be noted that in addition to the straight portion or the curved portion, the shape of the overlapping portion between the orthogonal projection of the drain 4 of the thin film transistor on the base substrate and the orthogonal projection of the recess structure 12 on the base substrate can further comprise other segment portions or other curved portions, which will not be specifically limited here.

In the above related embodiments, the recess structure 12 has a plurality of shapes. Specifically, the orthogonal projection of the recess structure 12 on the base substrate is in a shape of a square, a rectangle, a trapezoid or a semi-circle.

Furthermore, the orthogonal projection of the recess structure 12 on the base substrate can also be arranged upon needs in a shape of other polygons and so on.

Figure 5:
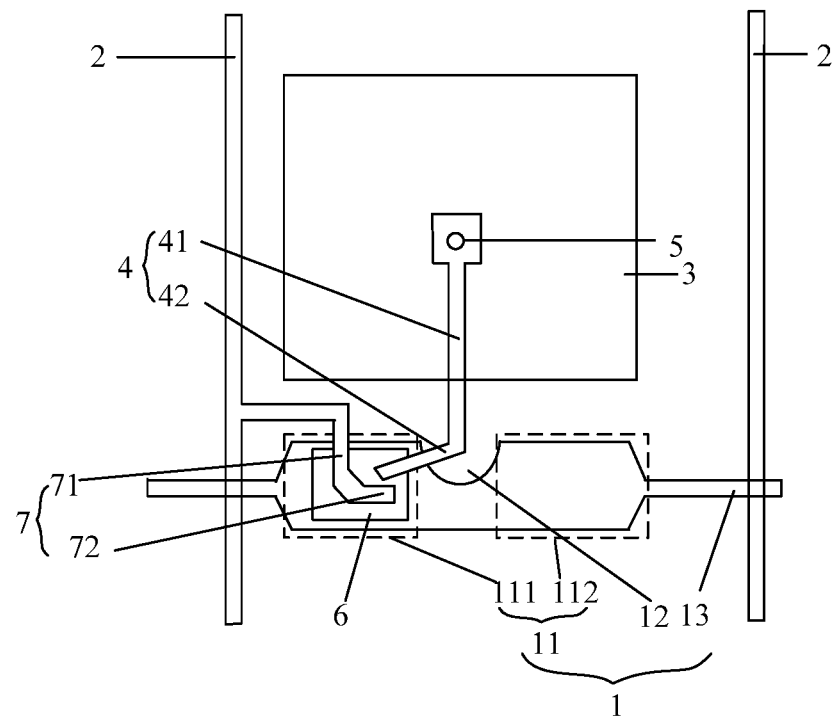
FIG. 5 is a schematic structure view of another array substrate according to an embodiment of this disclosure.

In an embodiment of this disclosure, the orthogonal projection of the recess structure 12 on the base substrate can be in a shape of a semi-circle. Referring to FIG. 5, in this embodiment, the orthogonal projection of the source 7 of the thin film transistor on the base substrate can be in an "L" shape.

Correspondingly, the source of the thin film transistor comprises a first side 71 and a second side 72 interconnecting with each other. Specifically, an extension direction of the first side 71 of the source of the thin film transistor is parallel with an extension direction of the data lines 2. Besides, an extension direction of the second side 72 of the source of the thin film transistor is parallel with an extension direction of the gate lines 1.

Figure 6:
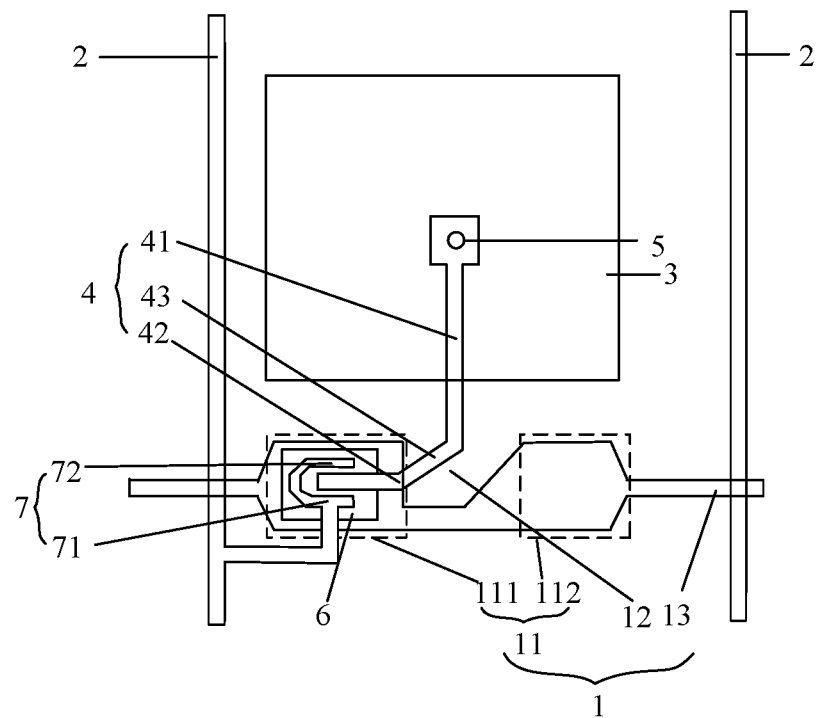
FIG. 6 is a schematic structure view of yet another array substrate according to an embodiment of this disclosure.

In an embodiment of this disclosure, the orthogonal projection of the recess structure 12 on the base substrate can be in a shape of a trapezoid. Referring to FIG. 6, in this embodiment, the orthogonal projection of the source 7 of the thin film transistor on the base substrate can be in a "U" shape.

Correspondingly, the drain 4 of the thin film transistor has a first segment 41, a second segment 42 and a third segment 43 interconnecting with each other. Specifically, an extension direction of the first segment 41 of the drain of the thin film transistor is parallel with an extension direction of the data lines 2, and the first segment 41 of the drain of the thin film transistor is connected with the pixel electrode 3 through the via hole 5. An extension direction of the second segment 42 of the drain of the thin film transistor is parallel with an extension direction of the gate lines 1, and an orthogonal projection of the second segment 42 of the drain of the thin film transistor on the base substrate partly overlaps the orthogonal projection of the active layer 6 of the thin film transistor on the base substrate. An orthogonal projection of the recess structure 12 on the base substrate at least partly overlaps an orthogonal projection of the third segment 43 of the drain of the thin film transistor on the base substrate, and the overlapping portion comprises a straight portion. For a range of the angle enclosed between the extension direction of the line connecting two ends of the straight portion and the extension direction of the gate lines 1, the above related embodiments can be referred to.

Correspondingly, the source 7 of the thin film transistor has a first side 71 and a second side 72 interconnecting with each other. Specifically, an extension direction of the first side 71 of the source of the thin film transistor is parallel with an extension direction of the gate lines 1. An extension direction of the second side 72 of the source of the thin film transistor is also parallel with an extension direction of the gate lines 1. The "U" shape of the source 7 of the thin film transistor opens towards the second segment 42 of the drain of the thin film transistor.

In the above related embodiments, the via hole 5 connecting the drain 4 of the thin film transistor with the pixel electrode 3 can be arranged in many different positions, which will be exemplarily illustrated as follows.

As an example, the via hole 5 connecting the drain 4 of the thin film transistor with the pixel electrode 3 can be located in a central portion of a region corresponding to the pixel electrode 3. As shown in FIG. 1, an orthogonal projection of the via hole 5 connecting the drain 4 of the thin film transistor with the pixel electrode 3 on the base substrate is located in a central portion of an orthogonal projection of the pixel electrode 3 on the base substrate. In this way, a voltage applied to the pixel electrode 3 can be balanced.

Figure 7:
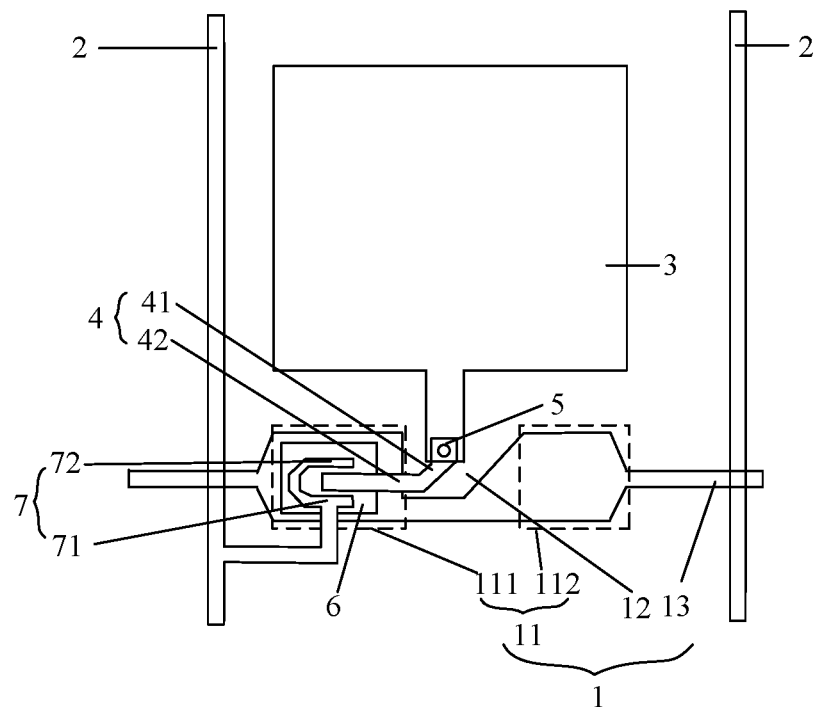
FIG. 7 is a schematic structure view of still another array substrate according to an embodiment of this disclosure.

As another example, the via hole 5 can be completely located within a region corresponding to the recess structure 12. As shown in FIG. 7, an orthogonal projection of the via hole 5 connecting the drain 4 of the thin film transistor with the pixel electrode 3 on the base substrate falls within an orthogonal projection of the recess structure 12 on the base substrate. In this way, the via hole 5 is present in a region corresponding to the recess structure 12, which improves an aperture ratio in a region defined by an adjacent gate line 1 and an adjacent data line 2.

Correspondingly, the drain 4 of the thin film transistor comprises a first segment 41 and a second segment 42 interconnected with each other. Specifically, the first segment 41 of the drain of the thin film transistor is connected with the pixel electrode 3 through the via hole 5. An orthogonal projection of the recess structure 12 on the base substrate at least partly overlaps the orthogonal projection of the first segment 41 of the drain of the thin film transistor on the base substrate, and the overlapping portion comprises a straight portion. For a range of the angle enclosed between the extension direction of the line connecting two ends of the straight portion and the extension direction of the gate lines 1, the above related embodiments can be referred to. An extension direction of the second segment 42 of the drain of the thin film transistor is parallel with an extension direction of the gate lines 1. An orthogonal projection of the second segment 42 of the drain of the thin film transistor on the base substrate partly overlaps an orthogonal projection of the active layer 6 of the thin film transistor on the base substrate.

Figure 8:
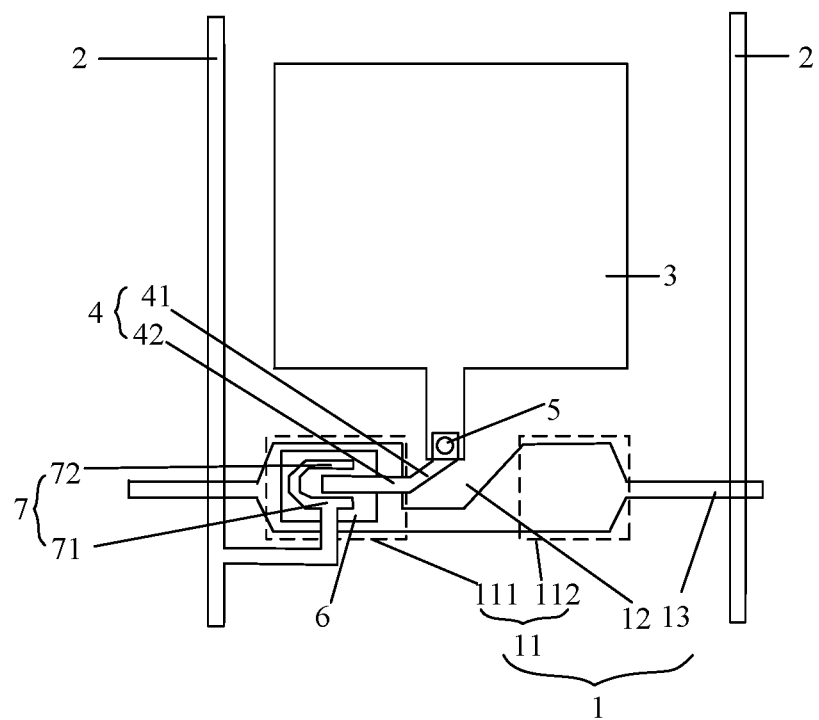
FIG. 8 is a schematic structure view of a further array substrate according to an embodiment of this disclosure.

As yet another example, the via hole 5 can be partly located within a region corresponding to the recess structure 12. As shown in FIG. 8, an orthogonal projection of the via hole 5 connecting the drain 4 of the thin film transistor with the pixel electrode 3 on the base substrate partly overlaps an orthogonal projection of the recess structure 12 on the base substrate. For the arrangement of other structures, please see FIG. 7.

In an embodiment of this disclosure, the connection of the drain of the thin film transistor with the pixel electrode through the via hole can either be a direct contact connection of the drain of the thin film transistor with the pixel electrode through the via hole, or an electrical connection of the drain of the thin film transistor with the pixel electrode through the via hole. For example, the drain of the thin film transistor is connected with a further electrical structure through the via hole, and the pixel electrode is connected with the further electrical structure, such that electrical connection is formed between the drain of the thin film transistor and the pixel electrode through the via hole. Exemplarily, the electrical structure mentioned above comprises a wire and/or a capacitor.

Based on a same concept, an embodiment of this disclosure further provides a display device. The display device comprises an array substrate of any of the above embodiments. The display device can be any product or component having a display function, such as a liquid crystal panel, electronic paper, liquid crystal television, liquid crystal display, a digital photo frame, a handset, a tablet computer and the like.

In the array substrate and the display device provided by the embodiments of this disclosure, the gate lines comprise a widening portion between adjacent data lines. Accordingly, as compared with any existing approach, widths of the gate lines in some positions are greatly increased and resistances of the gate lines are decreased. This helps to reduce the time required for charging the coupling capacitances between the gate lines and the data lines, and thus reduces signal delay of the gate lines. Besides, since the widths are not increased at intersections of the gate lines and the data lines, the coupling capacitances between the gate lines and the data lines will not be increased. Furthermore, the widening portion further comprises a recess structure, which facilitates flexible wiring. Specifically, an orthogonal projection of the recess structure on the base substrate at least partly overlaps that of the drain of the thin film transistor on the base substrate. In other words, the drain of the thin film transistor passes through the recess structure. In this way, overlapping between the drain of the thin film transistor and the gate lines is reduced, and thereby the coupling capacitances between the drain of the thin film transistor and the gate lines can be reduced.

The array substrate and the display device provided by an embodiment of this disclosure are depicted above by taking limited array substrate structures as an example. Apparently, the specific embodiments are not limited to the array substrate structures mentioned in this disclosure. Besides, the array substrate structures shown in the drawings of the embodiments of this disclosure are only provided for illustrating contents of this disclosure, but not for limiting scopes of this disclosure.

Although preferred embodiments of this disclosure have been depicted, those skilled in the art benefiting from the teaching of this disclosure can make further variations and modifications to these embodiments. Therefore, the appended claims are intended to be construed as including the preferred embodiments and all variations and modifications falling within the scopes of this disclosure.

Obviously, those skilled in the art can make various modifications and variations to this disclosure without deviating from the spirits and the scopes of this disclosure. Thus, if these modifications and variations to this disclosure fall within the scopes of the claims of this disclosure and the equivalent techniques thereof, this disclosure is intended to include them too.

The invention claimed is:

1. An array substrate comprising:
   a base substrate,
   a plurality of gate lines each extending in a first direction on the base substrate,
   a plurality of data lines each extending in a second direction on the base substrate, the first direction intersecting with the second direction,
   a pixel electrode arranged in a region enclosed by two adjacent gate lines of the plurality of gate lines and two adjacent data lines of the plurality of data lines, and
   a thin film transistor arranged at an intersection between a gate line of the two adjacent gate lines and a data line of the two adjacent data lines, a drain of the thin film transistor being connected with the pixel electrode through a via hole, wherein
   the gate line comprises a widening portion between the two adjacent data lines,
   the widening portion comprising a recess structure, and
   an orthogonal projection of the recess structure on the base substrate at least partly overlapping an orthogonal projection of the drain of the thin film transistor on the base substrate,
   wherein an orthogonal projection of the via hole on the base substrate is at a center of an orthographic projection of the pixel electrode on the base substrate, or, an orthogonal projection of the via hole on the base substrate at least partly overlaps the orthogonal projection of the recess structure on the base substrate,
   wherein the widening portion comprises a first widening portion and a second widening portion, both the first widening portion and the second widening portion are completely between the two adjacent data lines, and an orthographic projection of an active layer of the thin film transistor on the base substrate is within an orthographic projection of the first widening portion on the base substrate but does not overlap with an orthographic projection of the second widening portion on the base substrate, and wherein orthographic projections of both a source and the drain of the thin film transistor on the base substrate at least partially overlap with the orthographic projection of the first widening portion on the base substrate, but do not overlap with the orthographic projection of the second widening portion on the base substrate.

2. The array substrate according to claim 1, wherein an overlapping portion between the orthogonal projection of the drain of the thin film transistor on the base substrate and the orthogonal projection of the recess structure on the base substrate at least comprises two straight portions, and wherein an angle enclosed between an extension direction of a line connecting two ends of one of the two straight portions and an extension direction of the gate lines is greater than 0° and smaller than 90°.

3. The array substrate according to claim 2, wherein the angle enclosed between the extension direction of the line connecting two ends of one of the two straight portions and the extension direction of the gate lines is greater than 30° and smaller than 60°.

4. The array substrate according to claim 1, wherein the orthogonal projection of the via hole on the base substrate falls within the orthogonal projection of the recess structure on the base substrate.

5. The array substrate according to claim 1, wherein the orthogonal projection of the recess structure on the base substrate is in a shape of a square, a rectangle, a trapezoid or a semi-circle.

6. A display device comprising the array substrate according to claim 1.

7. The display device according to claim 6, wherein an overlapping portion between the orthogonal projection of the drain of the thin film transistor on the base substrate and the orthogonal projection of the recess structure on the base substrate at least comprises two straight portions, and wherein an angle enclosed between an extension direction of a line connecting two ends of one of the two straight portions and an extension direction of the gate lines is greater than 0° and smaller than 90°.

8. The display device according to claim 7, wherein the angle enclosed between the extension direction of the line connecting two ends of one of the two straight portions and the extension direction of the gate lines is greater than 30° and smaller than 60°.

9. The display device according to claim 6, wherein the orthogonal projection of the via hole on the base substrate falls within the orthogonal projection of the recess structure on the base substrate.

10. The display device according to claim 6, wherein the orthogonal projection of the recess structure on the base substrate is in a shape of a square, a rectangle, a trapezoid or a semi-circle.

11. The array substrate according to claim 2, wherein the orthogonal projection of the recess structure on the base substrate is in a shape of a square, a rectangle, a trapezoid or a semi-circle.

12. The array substrate according to claim 3, wherein the orthogonal projection of the recess structure on the base substrate is in a shape of a square, a rectangle, a trapezoid or a semi-circle.

13. The array substrate according to claim 4, wherein the orthogonal projection of the recess structure on the base substrate is in a shape of a square, a rectangle, a trapezoid or a semi-circle.

* * * * *